US012633348B2

(12) United States Patent
Jia et al.

(10) Patent No.: US 12,633,348 B2
(45) Date of Patent: May 19, 2026

(54) CONTINUOUS PROGRAMMING OF MEMORY CELL SLICES IN A PROGRAMMING METHOD OF A MEMORY, MEMORY AND MEMORY SYSTEM

(71) Applicant: YANGTZE MEMORY TECHNOLOGIES CO., LTD., Wuhan (CN)

(72) Inventors: Jianquan Jia, Wuhan (CN); Junbao Wang, Wuhan (CN); Hongtao Liu, Wuhan (CN); Lei Jin, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 152 days.

(21) Appl. No.: 18/528,126

(22) Filed: Dec. 4, 2023

(65) Prior Publication Data

US 2025/0029660 A1 Jan. 23, 2025

(30) Foreign Application Priority Data

Jul. 20, 2023 (CN) .......................... 202310906076.X

(51) Int. Cl.
| | |
|---|---|
| *G11C 16/04* | (2006.01) |
| *G06F 12/02* | (2006.01) |
| *G11C 16/10* | (2006.01) |
| *G11C 16/34* | (2006.01) |

(52) U.S. Cl.
CPC .......... *G11C 16/10* (2013.01); *G06F 12/0246* (2013.01); *G11C 16/0483* (2013.01); *G11C 16/3459* (2013.01)

(58) Field of Classification Search
CPC . G11C 16/10; G11C 16/0483; G11C 16/3459; G11C 11/5628; G11C 16/08; G11C 16/3427; G11C 8/08; G06F 12/0246
USPC ..................................................... 365/185.18
See application file for complete search history.

(56) References Cited

U.S. PATENT DOCUMENTS

| | | | | |
|---|---|---|---|---|
| 10,685,689 B2 * | 6/2020 | Date | ..................... | G11C 16/28 |
| 10,720,215 B2 * | 7/2020 | Hsu | ....................... | G11C 16/10 |

* cited by examiner

*Primary Examiner* — Tha-O H Bui
(74) *Attorney, Agent, or Firm* — Conley Rose, P.C.

(57) ABSTRACT

A programming method includes applying a program voltage to a first word line coupled to a plurality of memory cells of a first memory cell slice and a plurality of memory cells of a second memory cell slice; and during a stage of applying the program voltage to the first word line, applying a turn-on voltage to a first select line and a second select line sequentially, wherein the first select line is coupled to a select transistor of the first memory cell slice, and the second select line is coupled to a select transistor of the second memory cell slice.

20 Claims, 15 Drawing Sheets

FIG. 1

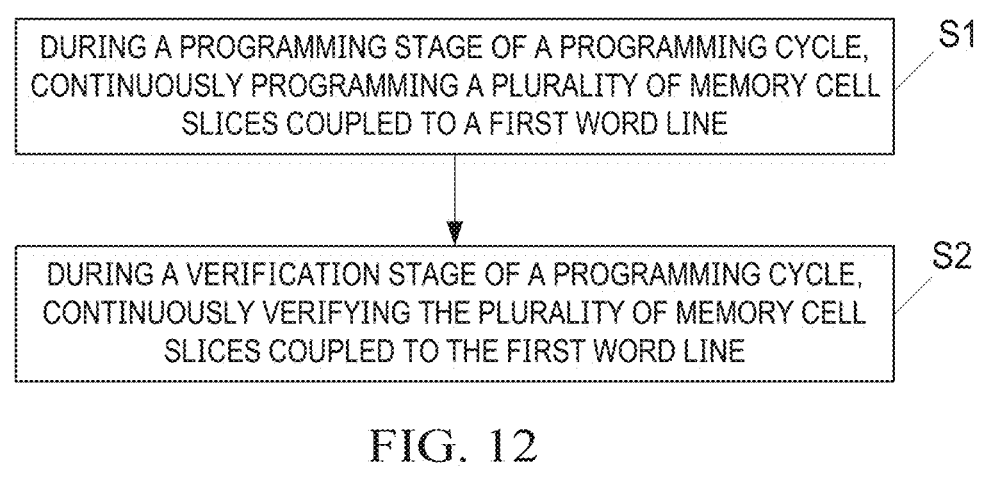

| DURING A PROGRAMMING STAGE OF A PROGRAMMING CYCLE, CONTINUOUSLY PROGRAMMING A PLURALITY OF MEMORY CELL SLICES COUPLED TO A FIRST WORD LINE | S1 |
|---|---|

↓

| DURING A VERIFICATION STAGE OF A PROGRAMMING CYCLE, CONTINUOUSLY VERIFYING THE PLURALITY OF MEMORY CELL SLICES COUPLED TO THE FIRST WORD LINE | S2 |
|---|---|

FIG. 12

CONTINUOUS PROGRAMMING OF MEMORY CELL SLICES IN A PROGRAMMING METHOD OF A MEMORY, MEMORY AND MEMORY SYSTEM

CROSS-REFERENCE TO RELATED APPLICATIONS

The present application claims priority to Chinese Patent Application No. 202310906076X, which was filed Jul. 20, 2023, is titled "A MEMORY PROGRAMMING METHOD, MEMORY AND MEMORY SYSTEM," and is hereby incorporated herein by reference in its entirety.

TECHNICAL FIELD

The present disclosure relates to the technical field of semiconductor chips, and in particular relates to a programming method of a memory, a memory and a memory system.

BACKGROUND

Not-NAND flash memories, owing to is characteristics such as data non-volatility, fast read and write speed, low power consumption, and long service life, have been widely used in various electronic products, such as mobile phones, computers, smart sensors, and positioning devices. As consumer requirements for the performance and reliability of electronic products increases, the market has put forward higher requirements for the read speed, write (also called program) speed, and service life of NAND flash memories.

SUMMARY

Examples disclosed in the present disclosure provide a programming method of a memory, a memory and a memory system.

The examples of the present disclosure employ the following technical solution.

In a first aspect, it is provided a programming method of a memory comprises: applying a program voltage to a first word line coupled to a plurality of memory cells of a first memory cell slice and a plurality of memory cells of a second memory cell slice; and during a stage of applying the program voltage to the first word line, applying a turn-on voltage to a first select line and a second select line sequentially, wherein the first select line is coupled to a select transistor of the first memory cell slice, and the second select line is coupled to a select transistor of the second memory cell slice.

In some examples, the programming method further comprises, after applying the program voltage to the first word line: applying a verification voltage to the first word line; and during a stage of applying the verification voltage to the first word line, applying a turn-on voltage to the first select line and the second select line sequentially.

In some examples, during a stage of applying the turn-on voltage to the first select line, applying a first pass voltage to a second word line, wherein the second word line is coupled to another plurality of memory cells of the first memory cell slice and another plurality of memory cells of the second memory cell slice; and during a stage of applying the turn-on voltage to the second select line, applying a second pass voltage to the second word line.

In some examples, the second pass voltage is greater than the first pass voltage.

In some examples, the programming method further comprises: during a stage of applying the turn-on voltage to the first select line, applying a third pass voltage to a third word line, wherein the third word line is coupled to a plurality of dummy memory cells of the first memory cell slice and a plurality of dummy memory cells of the second memory cell slice; and during a stage of applying the turn-on voltage to the second select line, applying a fourth pass voltage to the third word line.

In some examples, the fourth pass voltage is greater than the third pass voltage.

In some examples, the programming method further comprises: during the stage of applying the program voltage to the first word line, applying a first bit line voltage to a first bit line and a second bit line voltage to a second bit line, wherein the first bit line is coupled to one memory cell string of the first memory cell slice and one memory cell string of the second memory cell slice, and the second bit line is coupled to another memory cell string of the first memory cell slice and another memory cell string of the second memory cell slice. The first bit line is a selected bit line, and the first bit line voltage is a program select voltage. The second bit line is a non-selected bit line, and the second bit line voltage is a program inhibit voltage.

In some examples, the memory cells of the memory are single-level cells (SLC).

In a second aspect, it is provided a memory, comprising: a memory cell array comprising a first memory cell slice and a second memory cell slice; a first word line coupled to a plurality of memory cells of the first memory cell slice and a plurality of memory cells of the second memory cell slice; a first select line coupled to a select transistor of the first memory cell slice; a second select line coupled to a select transistor of the second memory cell slice; and a peripheral circuit coupled to the first word line, the first select line, and the second select line respectively, and configured to: apply a program voltage to the first word line; and during a stage of applying the program voltage to the first word line, apply a turn-on voltage to the first select line and the second select line sequentially.

In some examples, the peripheral circuit is further configured to, after applying the program voltage to the first word line: apply a verification voltage to the first word line; and during a stage of applying the verification voltage to the first word line, apply a turn-on voltage to the first select line and the second select line sequentially.

In some examples, the memory further comprises: a second word line coupled to another plurality of memory cells of the first memory cell slice and another plurality of memory cells of the second memory cell slice; and the peripheral circuit is further configured to: during a stage of applying the turn-on voltage to the first select line, apply a first pass voltage to the second word line; and during a stage of applying the turn-on voltage to the second select line, apply a second pass voltage to the second word line.

In some examples, the second pass voltage is greater than the first pass voltage.

In some examples, the memory further comprises: a third word line coupled to a plurality of dummy memory cells of the first memory cell slice and a plurality of dummy memory cells of the second memory cell slice; and the peripheral circuit is further configured to: during a stage of applying the turn-on voltage to the first select line, apply a third pass voltage to a third word line; and during a stage of applying the turn-on voltage to the second select line, apply a fourth pass voltage to the third word line.

In some examples, the fourth pass voltage is greater than the third pass voltage.

In some examples, the memory further comprises: a first bit line coupled to one memory cell string of the first memory cell slice and one memory cell string of the second memory cell slice; a second bit line coupled to another memory cell string of the first memory cell slice and another memory cell string of the second memory cell slice; and the peripheral circuit is further configured to: during the stage of applying the program voltage to the first word line, apply a first bit line voltage to the first bit line and a second bit line voltage to the second bit line.

In some examples, the memory cells of the memory are single-level cells SLC.

In a third aspect, it is provided a memory system, comprising a memory controller and the memory in the above second aspect, wherein the memory controller is configured to control the memory.

In some examples, the peripheral circuit is further configured to, after the stage of applying the program voltage to the first word line: apply a verification voltage to the first word line; and during a stage of applying the verification voltage to the first word line, apply a turn-on voltage to the first select line and the second select line sequentially.

In some examples, the memory further comprises: a second word line coupled to another plurality of memory cells of the first memory cell slice and another plurality of memory cells of the second memory cell slice, wherein the peripheral circuit is further configured to: during a stage of applying the turn-on voltage to the first select line, apply a first pass voltage to the second word line; and during a stage of applying the turn-on voltage to the second select line, apply a second pass voltage to the second word line.

In some examples, the second pass voltage is greater than the first pass voltage.

In a fourth aspect, it is provided a computer-readable storage medium storing therein computer-executable instructions that, when executed, enable the method of any of the above-mentioned first aspect.

In a fifth aspect, it is provided a computer device, comprising a processor, and a readable storage medium coupled to the processor, wherein the readable storage medium stores executable instructions that, when executed by the processor, enable the method of any of the above-mentioned first aspect.

In a sixth aspect, it is provided another programming method of a memory, comprising: applying a program voltage to a first word line coupled to a plurality of memory cells of each of a plurality of memory cell slices; and during a stage of applying the program voltage to the first word line, applying a turn-on voltage to a plurality of select lines sequentially, wherein each of the plurality of select lines is coupled to a select transistor of a corresponding one of the plurality of memory cell slices.

In some examples, during a stage of applying the turn-on voltage to a first select line of the plurality of select lines, applying a first pass voltage to a second word line coupled to another plurality memory cells of each of the plurality of memory cell slices; and during a stage of applying the turn-on voltage to a second select line of the plurality of select lines, applying a second pass voltage to the second word line; and wherein the stage of applying the turn-on voltage to the second select line is after the stage of applying the turn-on voltage to the first select line.

BRIEF DESCRIPTION OF THE DRAWINGS

To explain the examples in the present disclosure more clearly, the accompanying drawings used in describing some examples of the present disclosure will be briefly introduced below. The accompanying drawings in the following description are merely figures of some examples of the present disclosure. For those of ordinary skill in the art, other drawings can also be obtained based on these drawings. In addition, the drawings in the following description can be regarded as schematic diagrams, and are not limitations on the actual size of the product, the actual process of the method, the actual timing of signals, and the like involved in the examples of the present disclosure.

Figure 1:
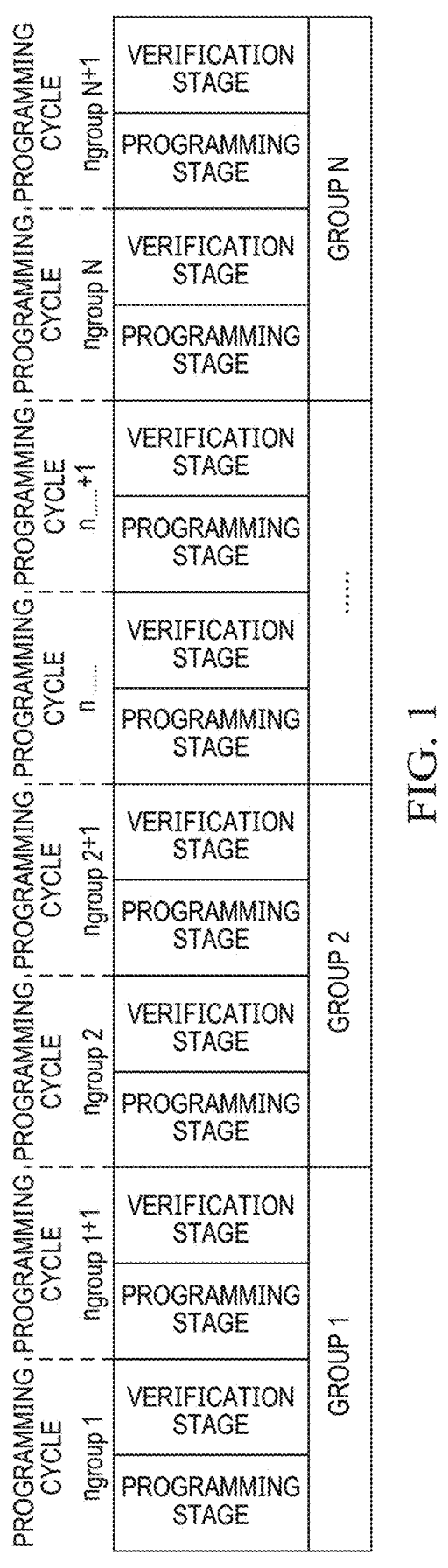

FIG. 1 is a possible schematic flow chart for programming a memory according to an example of the present disclosure.

FIG. 12 is a schematic flowchart of a programming method of a memory according to an example of the present disclosure.

Figure 2:
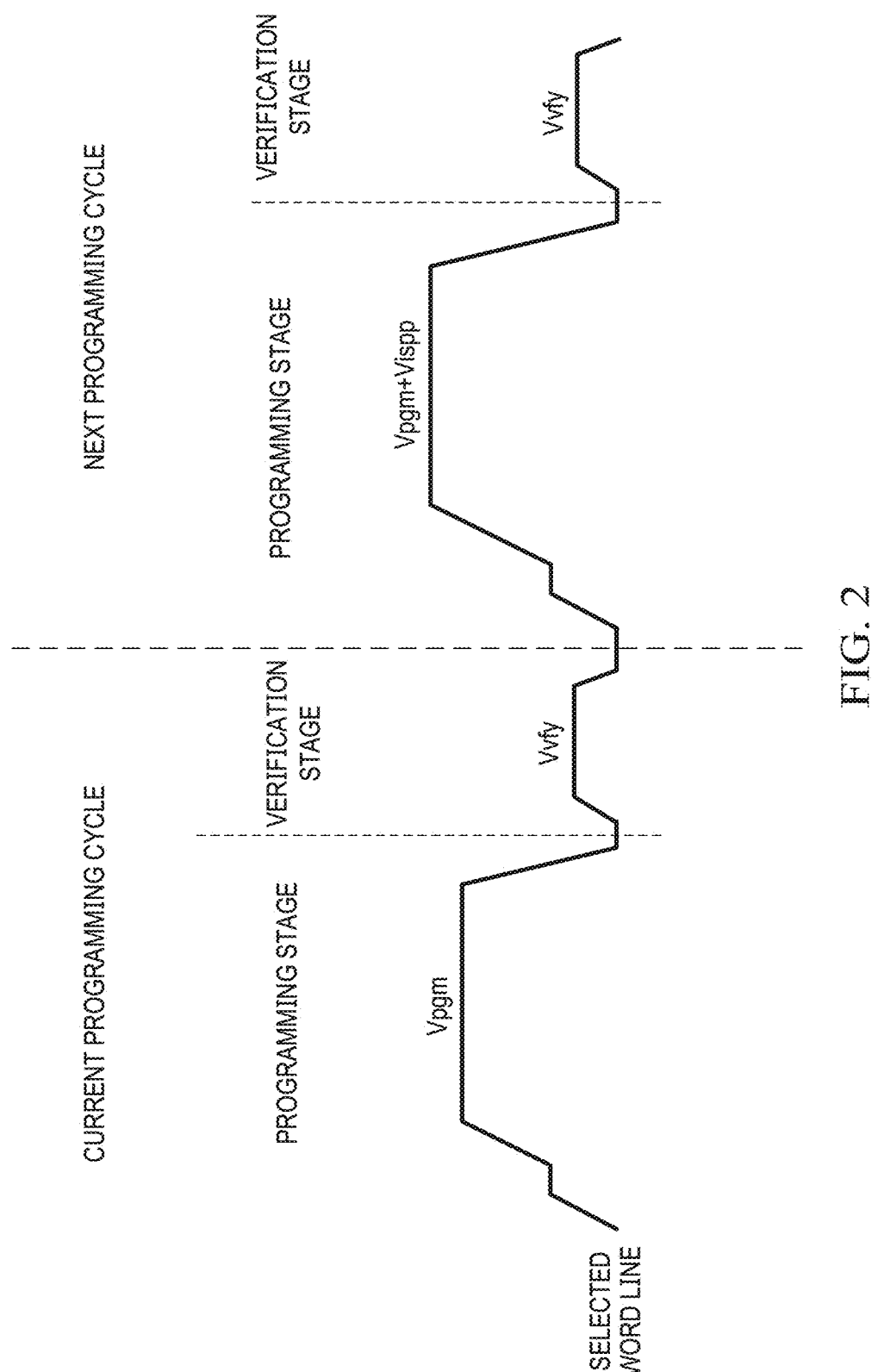
FIG. 2 is the schematic diagram of a voltage waveform of a selected word line of ISSP programming according to an example of the present disclosure.

Reference numerals: 300, memory system; 310, memory controller; 320, memory; 400, memory cell array; 410, first memory cell slice; 411, memory cell string; 412, top select transistor; 413, dummy memory cell; 414, memory cell; 415, bottom select transistor; 420, second memory cell slice; 430, third memory cell slice; 440, fourth memory cell slice; 510, memory stack layer; 511, gate conductive layer; 512, dielectric layer; 520, substrate; 530, string select line; 540, word line; 550, ground select line; 600, peripheral circuit; 610, I/O interface; 620, control logic unit; 630, row decoder; 640, voltage generator; 650, column decoder; 660, page buffer; 670, data bus; 680, register.

DETAILED DESCRIPTION

The examples of the present disclosure will be described below in conjunction with FIGS. 1-15. The described examples are merely some of the examples of the present disclosure, not all of them. All other examples obtained by those of ordinary skill in the art based on the examples provided in the present disclosure fall within the protection scope of the present disclosure.

Throughout the specification and claims, the term "comprising" is interpreted in an open and inclusive sense, i.e., "including, but not limited to" unless required otherwise in the context. In the description of the specification, the terms "one example", "some examples", "example", "in some examples" are intended to indicate particular features, structures, materials or characteristics associated with the examples are included in at least one example of the present disclosure. Schematic representations of the above terms are not referring to the same example. Furthermore, the particular features, structures, materials or characteristics may be included in any suitable manner in any one or more examples.

Hereinafter, the terms "first" and "second" are used for descriptive purposes only, and shall not be understood as indicating or implying relative importance or implicitly specifying the quantity of indicated technical features. Thus, a feature defined by "first" and "second" may explicitly or implicitly include one or more of these features. In the description of the examples of the present disclosure, "plurality" means two or more, unless otherwise specified.

When describing some examples, the expression "coupled" and its derivatives may be used. For example, when describing some examples, the term "coupled" may be used to indicate that two or more components are in direct physical or electrical contact, and in this case, "coupled" can also be described as "connected". In addition, the term "coupled" may also mean that two or more components are not in direct contact with each other, but still cooperate or interact with each other. The examples disclosed herein are not limited by the context herein.

The use of "configured to" herein means open and inclusive language that does not exclude devices that are adapted to or configured to perform additional tasks or operations.

NAND flash memory is a non-volatile random access storage medium. NAND flash memory uses a floating gate transistor as a memory cell. Different from traditional transistors, the gate of the floating gate transistor includes a floating gate (FG) capable of storing charges in addition to the control gate. An insulating layer is provided between the floating gate and the control gate, and a tunneling layer (such as a silicon dioxide layer) is provided between the floating gate and the substrate.

Based on the tunneling (e.g., Fowler-Nordheim (FN)) effect, when a high voltage (a program voltage, for example, a program voltage of 20V) is applied to the control gate, a conductive passage (referred to as a channel for short) can be formed between a source (S) and a drain (D) of the floating gate transistor, and when a low voltage (a program select voltage, for example, a program select voltage of 0V) is applied to the substrate, a larger potential difference is formed between the control gate and the channel, so that the charges in the channel pass through the tunneling layer and enter the floating gate. This process is called a program operation. At the same time, because the tunneling layer isolates the floating gate from the substrate, and the insulating layer isolates the floating gate from the control gate, the floating gate can retain the charges for a long time even in the case of power failure, so that there will not be data loss in the case of power failure. Only when a high voltage is applied to the substrate and a low voltage is applied to the control gate, the charges in the floating gate can pass through the tunneling layer and enter the substrate. This process is called an erase operation.

The electric field that can be generated by the charges stored in the floating gate in turn affects the threshold voltage above which the floating gate transistor is turned on. The more charge stored in the floating gate, the greater the threshold voltage above which the floating gate transistor is turned on. When the threshold voltage of the floating gate transistor is greater than a threshold, it is identified as data "0", and when the threshold voltage is less than a threshold, it is identified as data "1", so that different information stored can be represented.

FIG. 1 shows a possible schematic flow chart for programming a memory. As shown in FIG. 1, multiple memory cell slices (also called memory cell groups) in the memory are programmed sequentially, the programming of each memory cell slice may include multiple programming cycles, and each programming cycle may include a programming stage and a verification stage. As an example, referring to FIG. 1, the memory cell slice (group 1) is programmed firstly, which may include multiple programming cycles. As an example, FIG. 1 shows two programming cycles (e.g., a programming cycle $n_{group1}$ and a programming cycle $n_{group1}+1$), and each programming cycle may include a programming stage and a verification stage. After the program operation of the current memory cell slice is completed, a program operation is performed on the next memory cell slice (for example, group 2). Similarly, the program operation performed on the next memory cell slice may also include multiple programming cycles (e.g., a programming cycle $n_{group2}$ and a programming cycle $n_{group2}+1$), and each programming cycle may include a programming stage and a verification stage.

As shown in FIG. 2, in the programming stage, the memory cells are programmed by applying a program voltage Vpgm to a selected word line (selected WL), and in the verification stage, the memory cells are verified by applying a verification voltage Vvfy to the selected WL. If the program operation fails (for example, Fail Bit Count (FBC) is greater than a threshold) and the number of loops of the programming cycle does not reach the maximum value, proceed to the next programming cycle. In the programming stage of the next programming cycle, the program voltage Vpgm is increased by an incremental voltage Vispp and then applied to the selected WL to program at least the memory cells that fail the verification. After that, proceed to the verification stage of the next programming cycle, and a verification voltage Vvfy is applied to the selected WL to verify at least a part of the memory cells that fail the verification in the verification stage of previous programming cycle. If the program operation is successful (for example, FBC is less than or equal to the threshold), or the number of loops of the programming cycle reaches the maximum value (at this time, the program operation is considered to fail), the program operation on the current memory cell slice is terminated.

Typically, in the same programming cycle, the voltage applied to the selected WL between the programming stage and the verification stage needs to drop from the program voltage Vpgm to zero, and then rise to the verification voltage Vvfy. In two adjacent programming cycles, the voltage applied to the selected WL between the verification stage of the current programming cycle and the next programming cycle needs to drop from the verification voltage Vvfy to zero, and then rise to the sum of the program voltage Vpgm and the incremental voltage Vispp. However, due to the influence of the inherent parameters of the voltage transmission line (resistance, parasitic inductance, parasitic capacitance, etc.), the voltage applied to the selected WL cannot rise and drop immediately. In other words, it takes time for the voltage applied to the selected WL to ramp up/down. The programming of multiple memory cell slices often needs to cycle the ramp-up voltage/ramp-down voltage multiple times, and thus the programming of the memory takes a longer time.

The example of the present disclosure continuously programs multiple memory cell slices in the programming stage of one programming cycle, for example, continuously programs multiple memory cell slices with one program voltage, thereby reducing the number of ramp-up/ramp-down of the program voltage to a certain extent, reducing the time needed for the ramp-up/ramp-down of the program voltage, and shortening the time needed for programming the memory.

Figure 3:
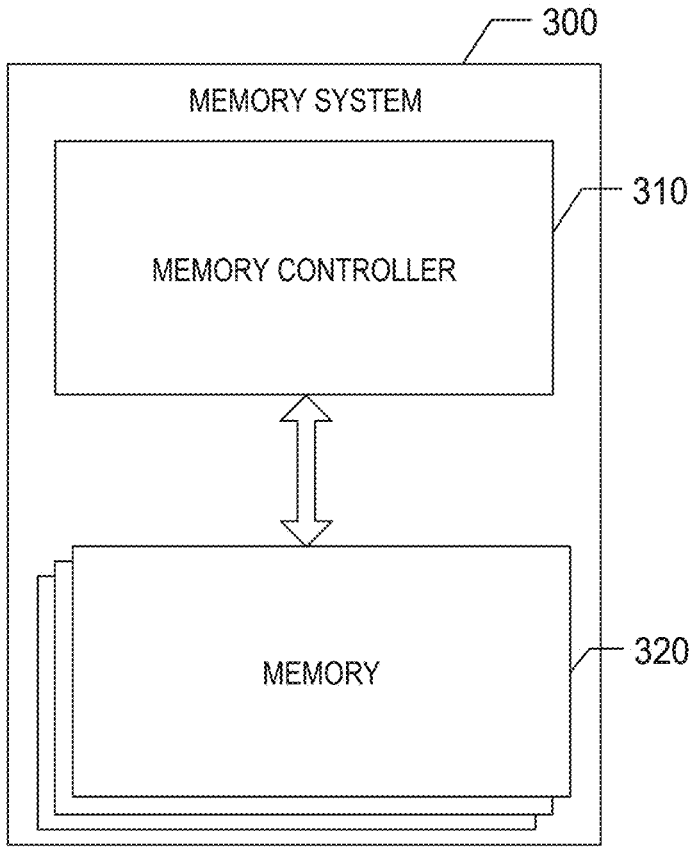
FIG. 3 is a schematic diagram of a memory system according to an example of the present disclosure.

As shown in FIG. 3, an example of the present disclosure provides a memory system 300, including a memory controller 310 and a memory 320. The memory controller 310 is configured to control data storage operations of the memory 320. The memory system 300 can be applied and packaged into different types of electronic devices, for example, mobile phones (for example, cell phones), desktop computers, tablet computers, notebook computers, servers, vehicle-mounted equipment, game consoles, printers, positioning devices, wearable devices, smart sensors, mobile power supply, virtual reality (VR) devices, augmented reality (AR) devices, servers and other electronic devices that can store data.

Of course, the memory controller 310 may also perform any other suitable functions, such as formatting the memory 320. For example, the memory controller 310 may communicate with external devices (e.g., a host) via at least one of various interface protocols. Interface protocols can include at least one of universal serial bus (USB) protocol, multimedia card (MMC) protocol, peripheral component interconnect (PCI) protocol, PCI Express (PCI-E) protocol, advanced technology attachment (ATA) protocol, serial ATA protocol, parallel ATA protocol, small computer system interface (SCSI) protocol, enhanced small disk interface (ESDI) protocol, or integrated drive electronics (IDE) protocol.

Figure 4:
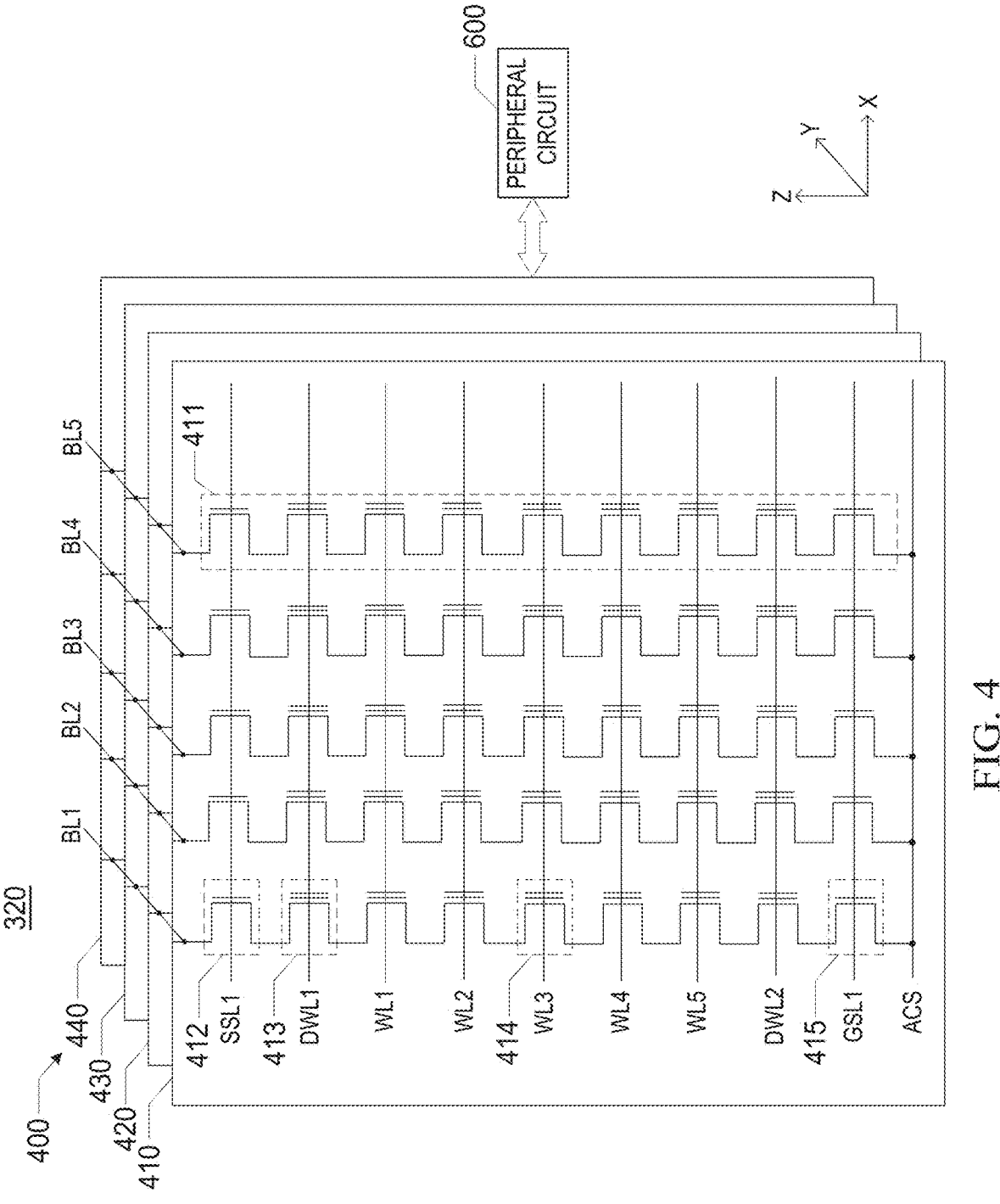
FIG. 4 is a schematic structural diagram of a memory and a memory cell array according to an example of the present disclosure.

In some examples, as shown in FIG. 4, the memory 320 above includes a memory cell array 400 and a peripheral circuit 600, and the memory cell array 400 is coupled to the peripheral circuit 600.

The memory cell array 400 may include multiple memory cell blocks, and each memory cell block may include N memory cell slices arranged along a Y axis, wherein N is a positive integer greater than or equal to 2, for example, N=4. Each memory cell slice includes M memory cell strings 411 arranged along a X axis, wherein M is a positive integer greater than or equal to 2, for example, N=6. Each memory cell string 411 may include a top select transistor (TSG) 412, a dummy (DMY) memory cell 413, multiple memory cells 414 and a bottom select transistor (BSG) 415. The X axis, the Y axis and the Z axis are respectively a horizontal axis, a longitudinal axis and a vertical axis of the space Cartesian coordinate system.

The memory cell string 411 of the memory cell slice can be coupled to the peripheral circuit 600 via a string select line (SSL), word lines (WL), bit lines (BL), a ground select line (GSL), a source line (SL) and the like.

Figure 5:
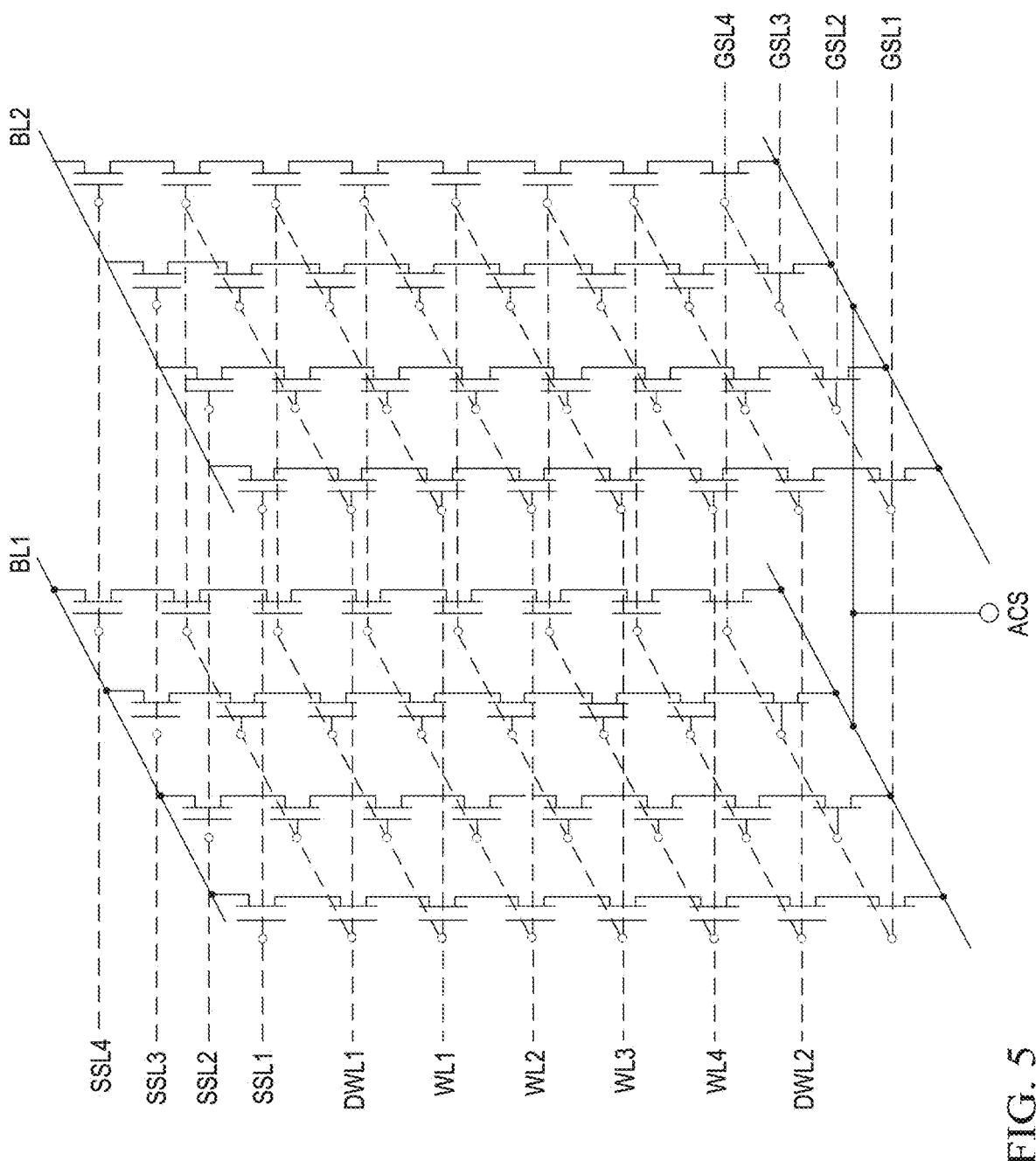
FIG. 5 is a schematic diagram of a connection structure of a memory cell array according to an example of the present disclosure.

As shown in FIG. 4 and FIG. 5, for M memory cell strings 411 of a same memory cell slice, the gates of the top select transistors 412 of each memory cell string 411 are all coupled to a same string select line, and the gates of the bottom select transistors 415 of each memory cell string 411 are all coupled to a same ground select line.

For N*M memory cell strings 411 of N memory cell slices, the control gate of the memory cell 414 in any memory cell string 411 and the control gate of the memory cell 414 at a corresponding position in other (N*M−1) memory cell strings 411 are coupled to a same word line. Furthermore, the control gate of the dummy memory cell 413 in any memory cell string 411 and the control gate of the dummy memory cell 413 at a corresponding position in other (N*M−1) memory cell strings 411 are coupled to a same dummy word line (DWL).

The M memory cell strings 411 of the memory cell slice are coupled to peripheral circuits via M bit lines in one-to-one correspondence. For example, the drains of the top select transistors 412 in the memory cell string 411 are coupled to a bit line. To reduce the number of bit lines, the memory cell strings 411 of N memory cell slices can share M bit lines. For example, the memory cell string 411 in any memory cell slice and the memory cell strings 411 at a corresponding position in other (N−1) memory cell slices are coupled to a same bit line.

The sources of the bottom select transistors 415 in the N*M memory cell strings 411 may be coupled to a common source line (CSL), which may also be referred to as an array common source (ACS). The drawings of this disclosure only show the structure of the memory by way of example, but in practice, the structure of the memory can also be in other ways. For example, the sources of the bottom select transistors 415 in the N*M memory cell strings 411 can be connected in a manner similar to the drains, and the memory cell strings 411 in N memory cell slices can share M source lines. For example, the memory cell string 411 in any memory cell slice and the memory cell strings 411 at a corresponding position in other (N−1) memory cell slice are coupled to a same source line.

Figure 6:
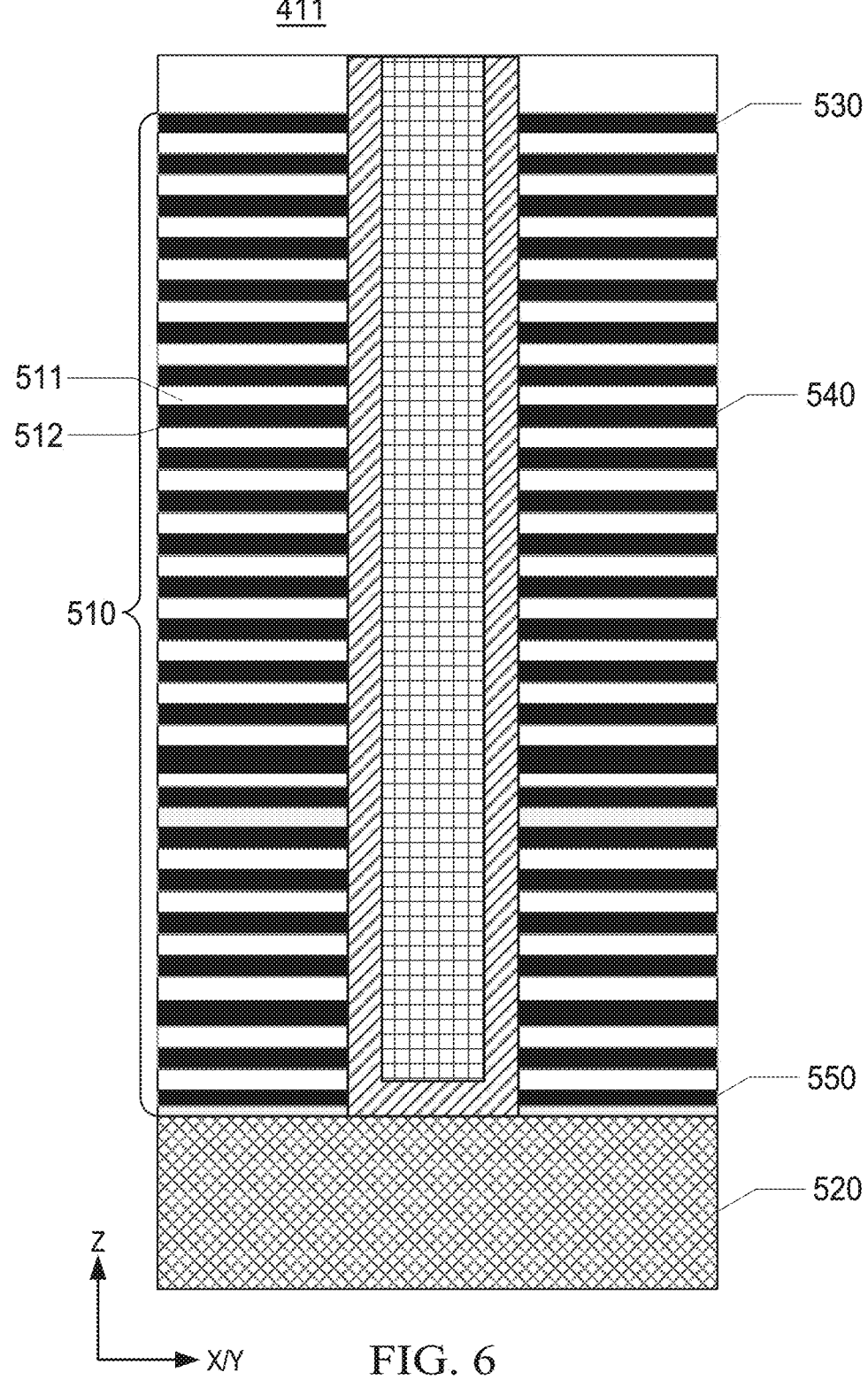
FIG. 6 is a possible partial cross-sectional view of a cross-section of a memory cell array according to an example of the present disclosure.

FIG. 6 shows a possible partial cross-sectional view of a cross-section of a memory cell string according to the present disclosure. The memory cell string 411 may vertically extend above the substrate 520 through the memory stack layer 510. The substrate 520 may include silicon (e.g., monocrystalline silicon), silicon germanium (SiGe), gallium arsenide (GaAs), germanium (Ge), silicon-on-insulator (SOI), germanium-on-insulator (GOI), or any other suitable materials.

The memory stack layer 510 may include alternating gate conductive layers 511 and dielectric layers 512. The number of memory cells 414 in memory cell array 400 may be determined based on the number of pairs of gate conductive layers 511 and dielectric layers 512 in the memory stack layer 510.

The gate conductive layer 511 may include conductive materials including but not limited to tungsten (W), cobalt (Co), copper (Cu), aluminum (Al), polysilicon, doped silicon, silicide or any combination thereof. In some examples, each gate conductive layer 511 includes a metal layer, such as a tungsten layer. In some examples, each gate conductive layer 511 includes a doped polysilicon layer. Each gate conductive layer 511 may include a control gate surrounding the memory cell 414, and the gate conductive layer 511 at the top of the memory stack layer 510 may extend laterally as a string select line 530, the gate conductive layer 511 at the bottom of the memory stack layer 510 can extend laterally as a ground select line (GSL) 550, or the gate conductive layer 511 between the string select line 530 and the ground select line 550 can extend laterally as a word line 540.

Although not shown in FIG. 6, additional components of the memory cell array 400 may be formed, including but not limited to gate line slits/source contacts, local contacts, interconnect layers, and the like.

Figure 7:
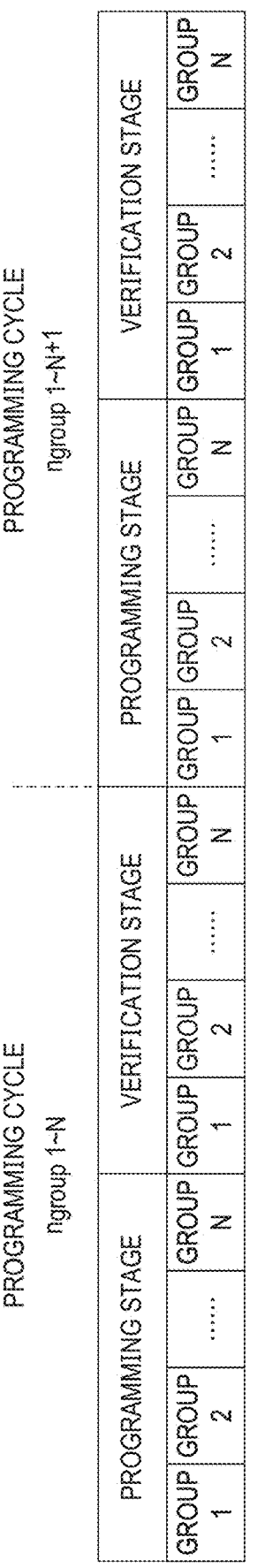
FIG. 7 is a schematic flow chart of memory programming according to an example of the present disclosure.

As shown in FIG. 7, the peripheral circuit 600 continuously programs a plurality of memory cell slices during a programming stage of a programming cycle. Correspondingly, the peripheral circuit 600 continuously verifies the plurality of memory cell slices programmed in the programming stage during a verification stage after the programming stage in the programming cycle.

In an example, the memory cells 414 in the memory 320 are single-level cells SLC. For example, the memory cells 414 in the memory cell array 400 are single-level cells SLC. For example, one memory cell 414 stores 1 bit of data, for example, only stores 0 and 1. Therefore, compared with multi-level cells, the number of loops of the programming cycle is less when programming SLC (for example, the number of times the program voltage is applied to the first word line is less), and the number of the memory cells in an erased state in the SLC (the memory cells with the erased state as a target state does not need to be programmed) is relatively large, so that the program disturbance is lower.

This disclosure is not limited only to the programming of SLC, and is likewise applicable to multi-level cell (MLC), trinary-level cell (TLC), quad-level cell (QLC) and so on.

As an example, the memory cell array 400 includes at least one memory cell block. The memory cell block may include a first memory cell slice (group 1) 410 and a second memory cell slice (group 2) 420. For example, in the programming stage of one programming cycle, while applying a program voltage Vpgm to a first word line (for example, the selected word line, for example, WL1 in FIG. 4) coupled to a plurality of memory cells 414 of the first memory cell slice 410 and a plurality of memory cells 414 of the second memory cell slice 420, the peripheral circuit 600 applies a turn-on voltage Von to a first select line coupled to the first memory cell slice 410, and then applies the turn-on voltage to a second select line coupled to the second memory cell slice 420.

The present disclosure is illustrated by the example of the first select line being the first string select line SSL1 and the second select line being the second string select line SSL2 for illustration. The first select line may also be the first ground select line GSL1, and the second select line may also be the second ground select line GSL2.

The first word line is coupled to a plurality of memory cells 414 of the first memory cell slice 410 and a plurality of memory cells of the second memory cell slice 420. In an order from the top select transistor 412 to the bottom select transistor 415, the first word line WL1 is coupled to the control gates of first memory cells 414 of all memory cell strings 411 of the first memory cell slice 410 (a first memory cell slice along the Y-axis direction in FIG. 4) and the control gates of the first memory cells 414 of all memory cell strings 411 of the second memory cell slice 420 (a second memory cell slice along the Y-axis direction in FIG. 4).

The first string select line SSL1 is coupled to the gates of the top select transistors 412 of all memory cell strings 411 of the first memory cell slice 410, and the second string select line SSL2 is coupled to the gates of the top select transistor 412 of all memory cell strings 411 of the second memory cell slice 420.

In the programming stage of one programming cycle, the peripheral circuit 600 also needs to apply a program select voltage Vss (for example, a program select voltage Vss of 0 V) or a program inhibit voltage Vinhibit (for example, a program inhibit voltage Vinhibit of 3 V) to multiple bit lines (such as BL1-BL5 in FIG. 4) coupled to the first memory cell slice 410 and the second memory cell slice 420.

As shown in FIG. 4, the bit line BL1 is coupled to a first memory cell string 411 (along the X-axis direction in FIG. 4) of the first memory cell slice 410 and a first memory cell string 411 (along the X-axis direction in FIG. 4) of the second memory cell slice 420. For the coupling structure between bit lines BL2-BL5 and the first memory cell slice 410 and the second memory cell slice 420, reference may be made to the relevant description of the coupling structure between the bit line BL1 and the first memory cell slice 410 and the second memory cell slice 420 and FIG. 4, and will not be repeated in this disclosure.

In addition, the example of the present disclosure also continuously verifies the multiple memory cell slices during the verification stage of one programming cycle, for example, continuously verifies multiple memory cell slices with one verification voltage, thereby reducing the number of ramp-up/ramp-down of the verification voltage to a certain extent, further reducing the time needed for the ramp-up/ramp-down of the voltage, and shortening the time needed for programming the memory.

The difference from the programming stage is that in the verification stage after the programming stage of one programming cycle, the peripheral circuit 600 applies a verification voltage to the first word line, and applies a bit line voltage related to verification to the bit lines coupled to the first memory cell slice 410 and the second memory cell slice 420. For example, during the verification stage after the programming stage of one programming cycle, while applying the verification voltage to the first word line, the peripheral circuit 600 applies a turn-on voltage to the first string select line SSL1 firstly, and then applies a turn-on voltage to the second string select line SSL2.

Figure 8:
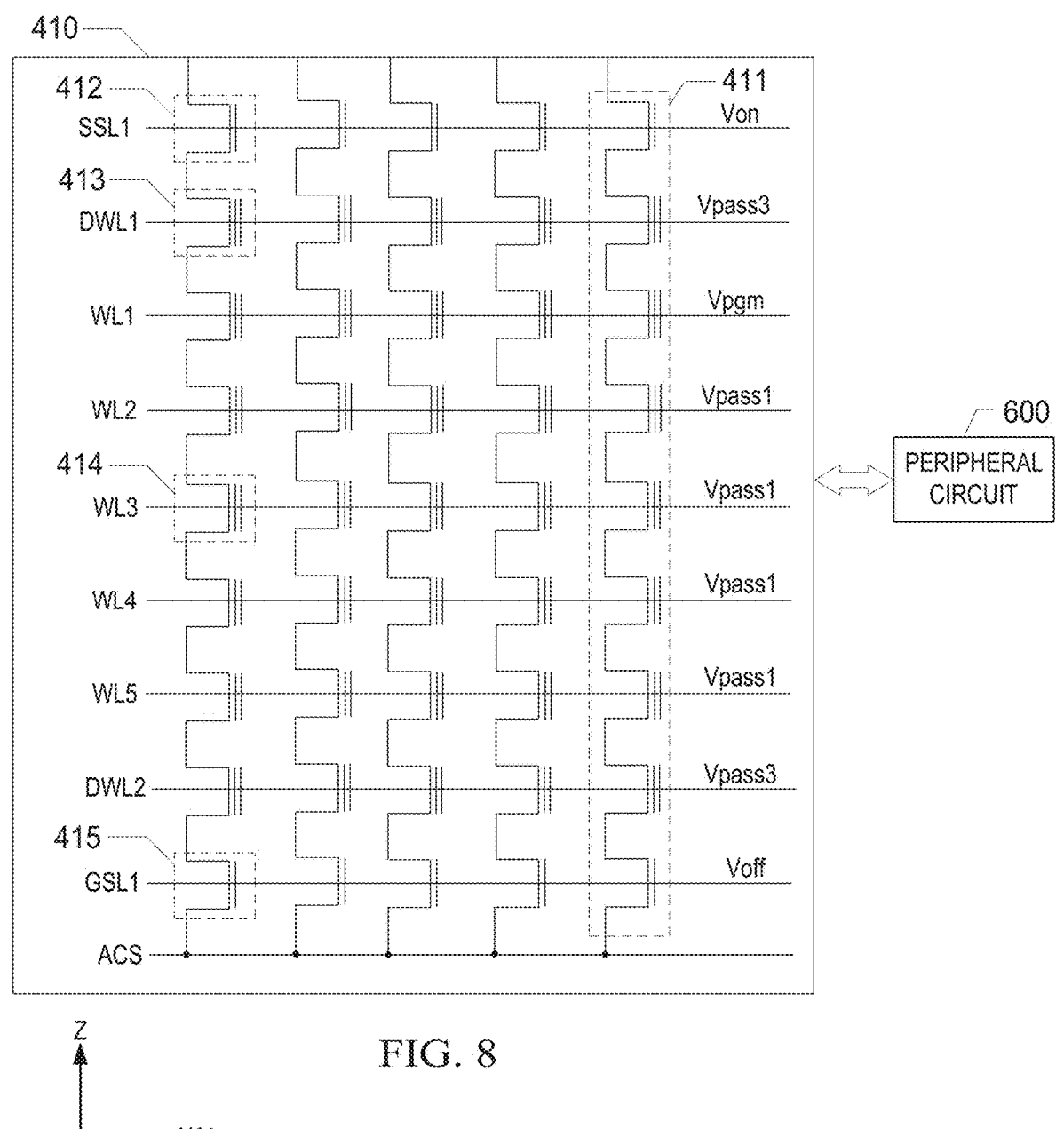
FIG. 8 is a schematic diagram of programming a first memory cell slice by a peripheral circuit according to an example of the present disclosure.
Figure 9:
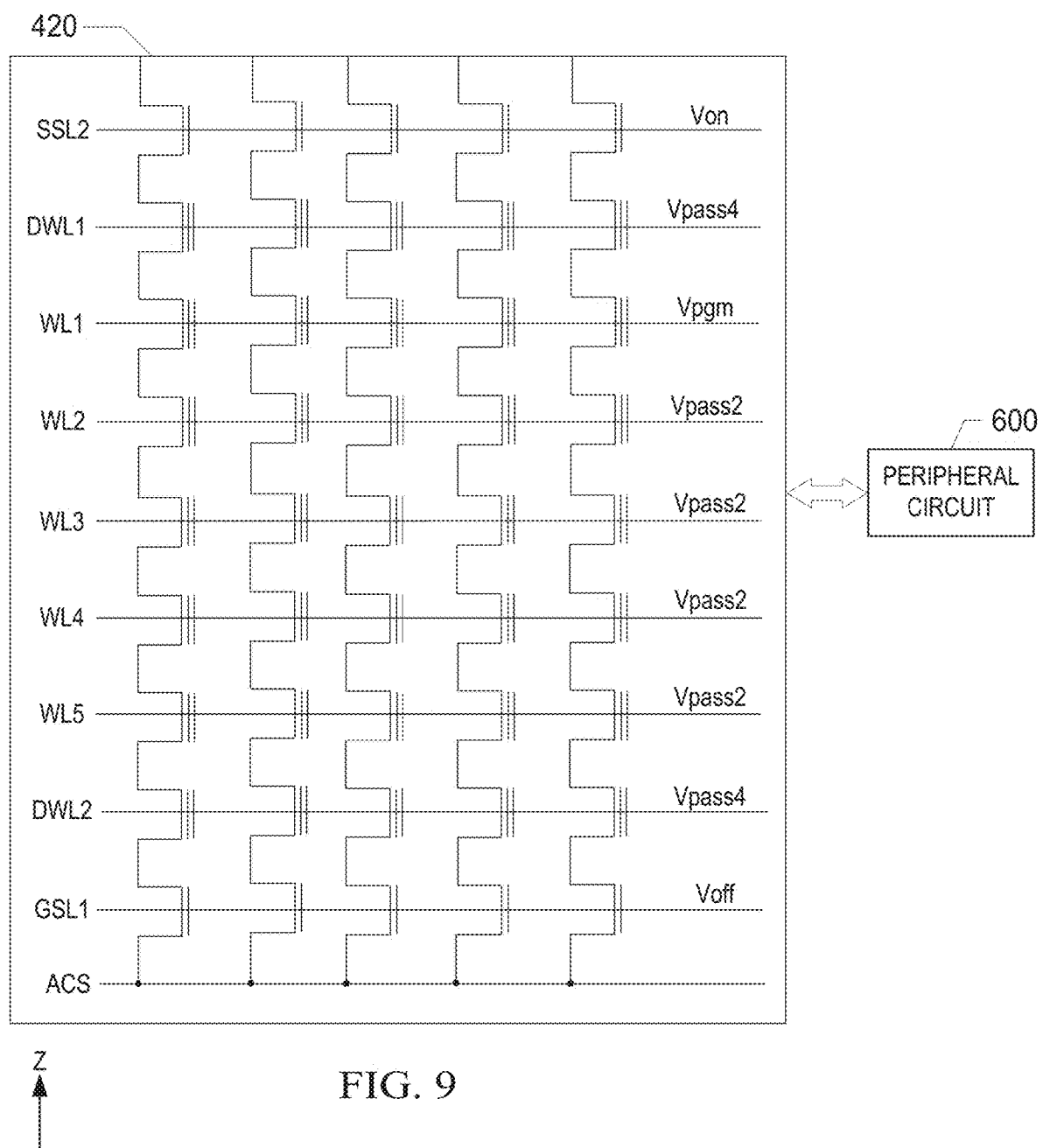
FIG. 9 is a schematic diagram of programming a second memory cell slice by a peripheral circuit according to an example of the present disclosure.

For 3D NAND flash memory, during a stage of applying the turn-on voltage Von to the first string select line SSL1 (as shown in FIG. 8), the peripheral circuit 600 also applies a first pass voltage Vpass1 to second word lines (for example, non-selected word lines, for example WL2-WL5). The second word lines are coupled to another plurality of memory cells 414 of the first memory cell slice 410 and another plurality of memory cells 414 of the second memory cell slice 420. Taking one word line WL2 of the second word lines as an example, the second word line WL2 is coupled to the control gates of the second memory cells 414 of all memory cell strings 411 of the first memory cell slice 410 and the control gates of the second memory cells 414 of all the memory cell strings 411 of the second memory cell slice 420 in an order from the top select transistor 412 to the bottom select transistor 415. During the stage of applying the turn-on voltage to a second string select line SSL2 (as shown in FIG. 9), the peripheral circuit 600 also applies a second pass voltage Vpass2 to the second word lines.

In addition, the memory cell string 411 often includes a dummy memory cell 413 coupled to a dummy word line. The dummy word lines may be controlled in a manner similar to the second word lines. Therefore, during the stage of applying the turn-on voltage Von to the first string select line SSL1 (as shown in FIG. 8), the peripheral circuit 600 also applies a pass voltage Vpass3 to third word lines (for example, dummy word lines, for example, DWL1 and DWL2). During the stage of applying the turn-on voltage Von to the second string select line SSL2 (as shown in FIG. 9), the peripheral circuit 600 also applies a fourth pass voltage Vpass4 to the third word lines.

The third word lines are coupled to a plurality of dummy memory cells 413 of the first memory cell slice 410 and a plurality of dummy memory cells 413 of the second memory cell slice 420. Taking one dummy word line DWL1 of the third word lines as an example, the third word line DWL1 is coupled to the control gates of the first dummy memory cells 413 of all memory cell strings 411 of the first memory cell slice 410 and the control gates of the first dummy memory cells 413 of all the memory cell strings 411 of the second memory cell slice 420 in an order from the top select transistor 412 to the bottom select transistor 415.

Figure 10:
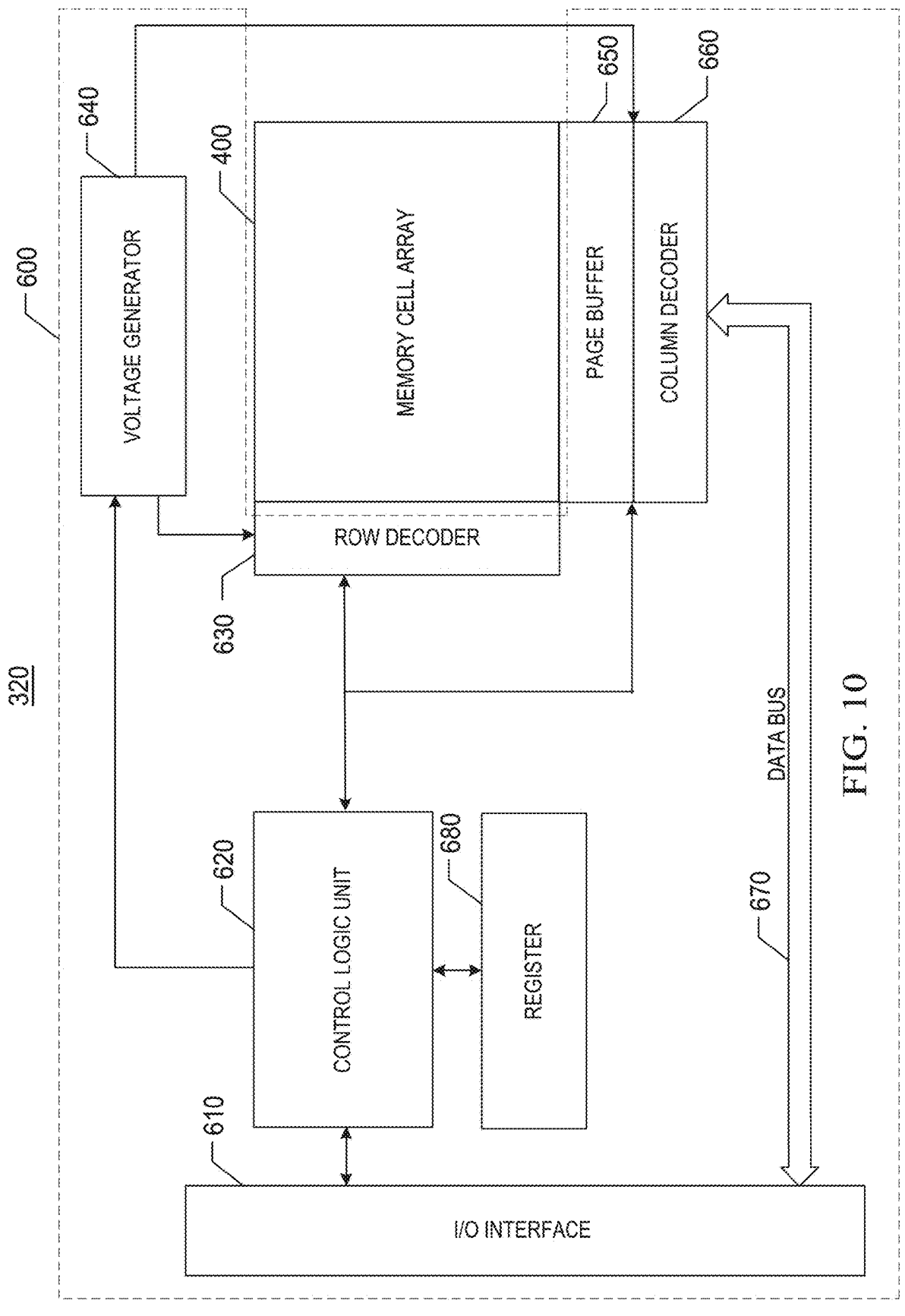
FIG. 10 is a schematic structural diagram of a memory and peripheral circuits according to an example of the present disclosure.

FIG. 10 shows a schematic structural diagram of a memory and a peripheral circuit. In FIG. 10, the peripheral circuit 600 includes an I/O interface 610, a control logic unit 620, a row decoder 630, a voltage generator 640, a column decoder 650, a page buffer 660, a data bus 670 and a register 680. In some examples, additional circuits not shown in FIG. 10 may also be included.

The I/O interface 610 may be coupled to the control logic unit 620 and act as a control buffer to buffer and relay control commands received from a memory controller (e.g., memory controller 310 in FIG. 3) to the control logic unit 620, and buffer and relay status information received from the control logic unit 620 to the host. I/O interface 610 may also be coupled to the page buffer 660 via the data bus 670 and act as a data I/O interface 610 and data buffer to buffer and relay data to or from memory cell array 400.

The control logic unit 620 may be coupled to the voltage generator 640, the page buffer 660, the column decoder 650, the row decoder 630, the I/O interface 610 and the like, and be configured to control operations of various peripheral circuits. The control logic unit 620 may generate operation signals in response to a command (CMD) or a control signal from the memory controller 310 to control operations of the row decoder 630, the column decoder 650, the page buffer 660, and the voltage generator 640. The command may be a program command, a read command, etc.

The row decoder 630 may supply a word line voltage generated from the voltage generator 640 to the selected word lines and the non-selected word lines of the memory cell array 400 in response to the control of the control logic unit 620. As described below, the row decoder 630 is configured to perform a program operation on memory cells coupled to one or more selected word lines in the memory cell array 400.

The voltage generator 640 may use an external power supply voltage or an internal power supply voltage to generate various voltages for performing operations such as erase, program, read, and verify on the memory cell array 400, such as a program voltage Vpgm, a pass voltage Vpass, a read voltage Vread, a verification voltage Vvfy and the like applied to the word lines, and a program inhibit voltage Vinhibit, a program select voltage Vss and the like applied to the bit lines, and combinations thereof.

The column decoder 650 may select one or more memory cell strings 411 of the memory cell array 400 in response to the control of the control logic unit 620 and by applying the bit line voltage generated from the voltage generator 640.

The page buffer 660 may read data from and program (write) data to the memory cell array 400 according to a control signal from the control logic unit 620. In one example, the page buffer 660 may store program data (write data) to be programmed into the memory cell array 400. In another example, page buffer 660 may perform a program verification operation to ensure that data has been correctly programmed into memory cells 414 coupled to the selected word line. In yet another example, the page buffer 660 may also detect low power signals from bit lines representing data bits stored in memory cells 414 and amplify small voltage swings to recognizable logic levels during read operations.

The register 680 may be coupled to the control logic unit 620 and include status registers, command registers and address registers for storing status information, command operation codes (OP codes) and command addresses for controlling the operations of each peripheral circuit.

Operations performed by the row decoder 630, the page buffer 660, the control logic unit 620, and the voltage generator 640 described in this disclosure may be performed by a processing circuit. The processing circuit may include, but is not limited to, hardware of a logic circuit or a hardware/software combination of a processor executing software.

Figure 11:
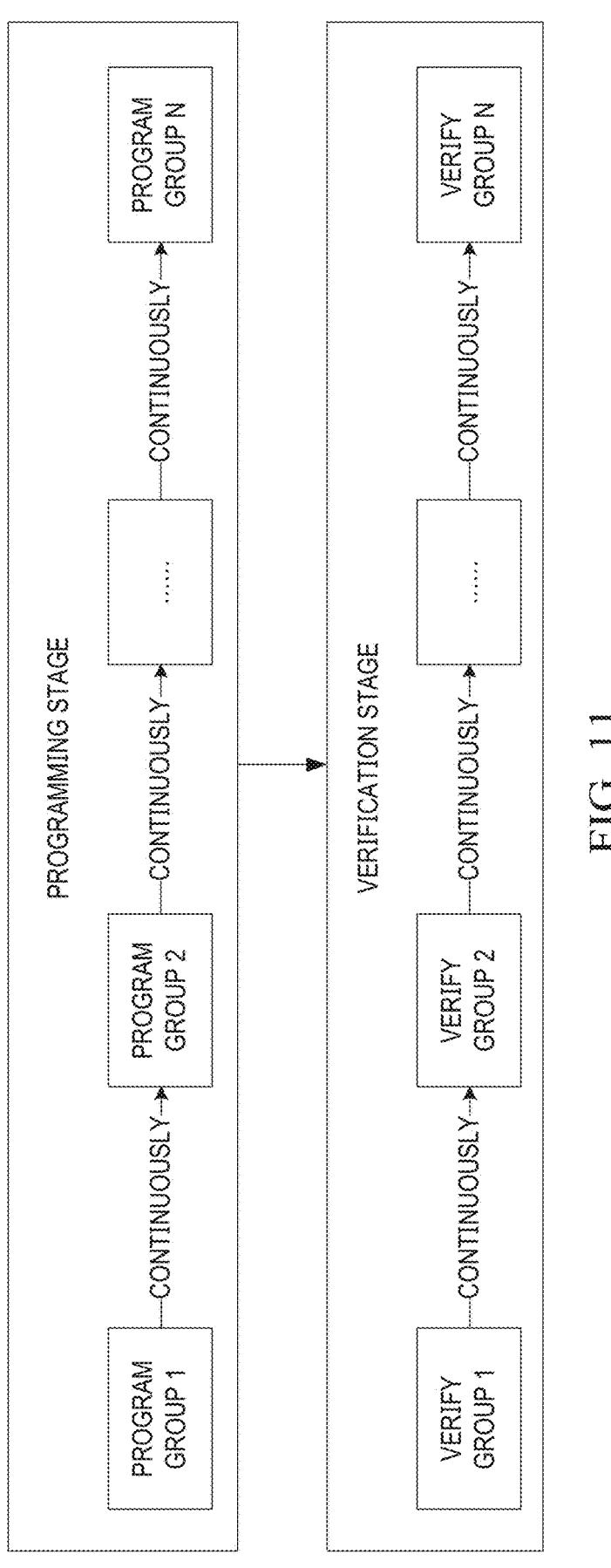
FIG. 11 is a schematic flow diagram of programming memory cell slices by the peripheral circuit according to an example of the present disclosure.

As shown in FIG. 11, during the programming stage of a programming cycle, the peripheral circuit 600 continuously programs a plurality of memory cell slices, and during the verification stage after the programming stage of the programming cycle, the peripheral circuit 600 continuously verifies the plurality of memory cell slices programmed in the programming stage.

In some examples, when the above-mentioned peripheral circuit 600 is operating, the programming method shown in FIG. 12 is performed to implement the programming process shown in FIG. 11. The programming method includes operations S1-S2, and at least one of operations S1 or S2 can be executed.

Operation S1. During a programming stage of a programming cycle, continuously programming a plurality of memory cell slices coupled to a first word line.

Figure 13:
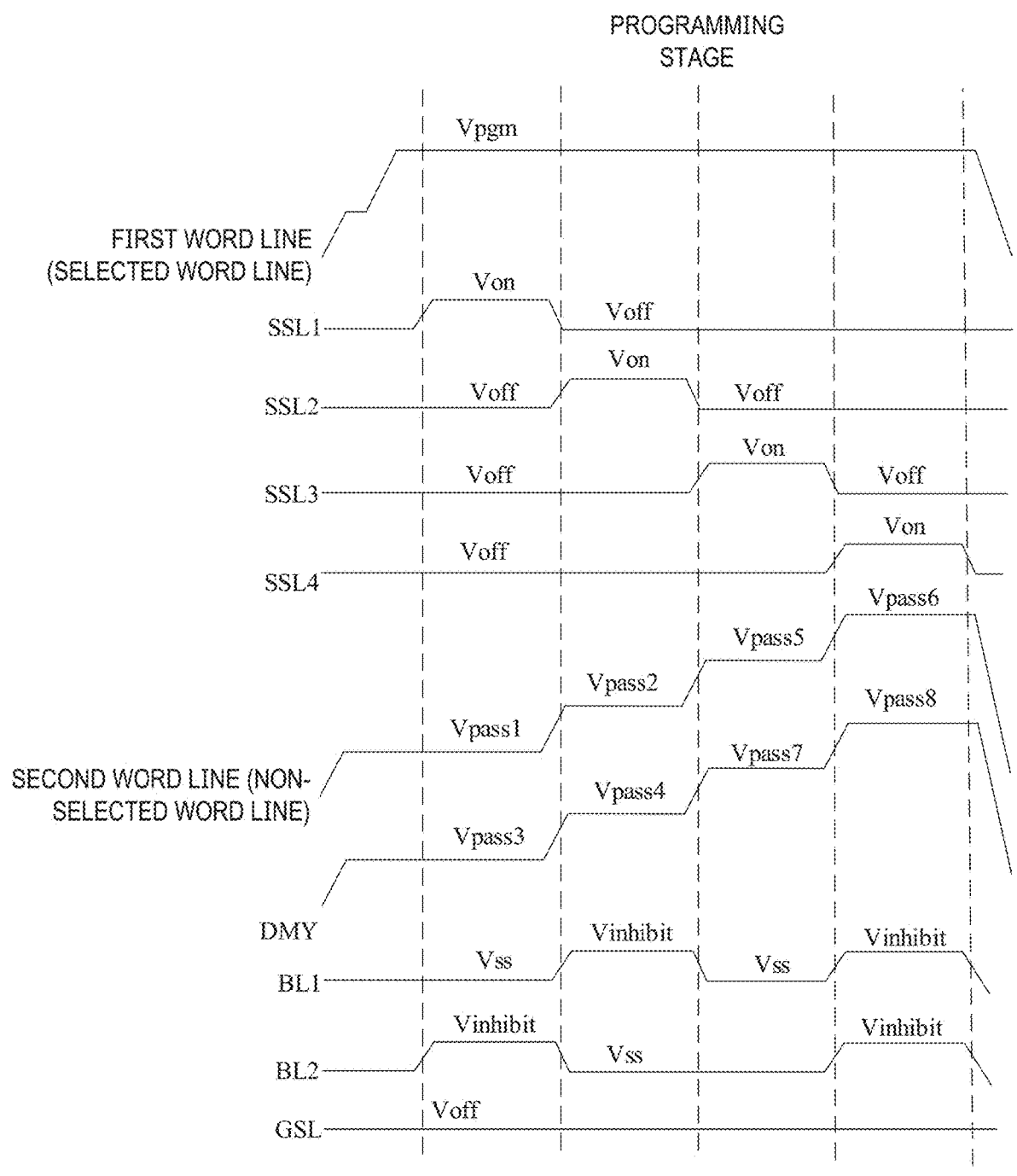
FIG. 13 is a schematic diagram of a possible voltage waveform for programming a memory according to an example of the present disclosure.

As shown in FIG. 13, when the control logic unit 620 controls the row decoder 630 to supply a program voltage Vpgm generated by the voltage generator 640 to a first word line (for example the selected word line), the control logic unit 620 also controls row decoder 630 to supply a turn-on voltage Von generated by the voltage generator 640 to a plurality of string select lines SSL sequentially and to supply a turn-off voltage Voff to a ground select line GSL. In an example, only one of the string select lines is applied with the turn-on voltage Von, and the rest of the string select lines are applied with the turn-off voltage Voff. When the selected line is the ground select line, the control logic unit 620 controls the row decoder 630 to sequentially supply the turn-on voltage Von generated by the voltage generator 640 to the plurality of ground select lines GSL and to supply the turn-off voltage Voff to the string select line SSL.

Figure 14:
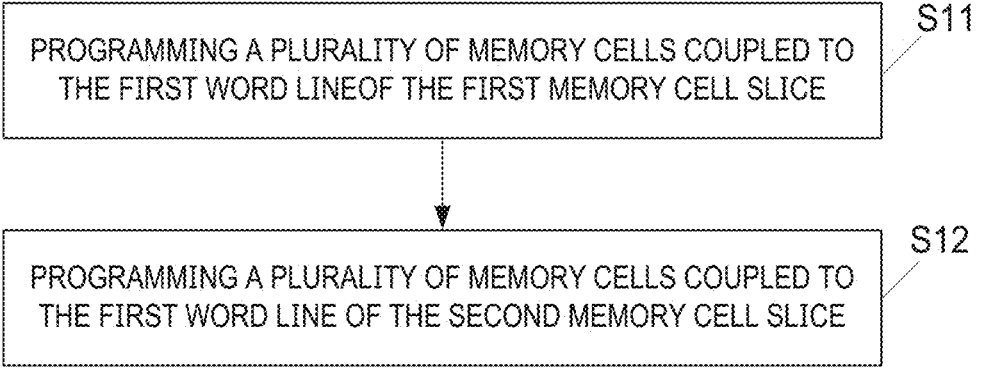
FIG. 14 is a schematic flowchart of operation S1 in the programming method according to an example of the present disclosure.

As an example, during the programming stage of a programming cycle, when the row decoder 630 supplies the program voltage Vpgm to the first word line, it also supplies the turn-on voltage Von to the first string select line SSL1 and the second string select line SSL2 sequentially (and supplies the turn-off voltage Voff to the second string select line SSL2 and the first string select line SSL1 sequentially). For example, in the programming stage of the programming cycle, the row decoder 630 applies the same program voltage Vpgm to the first word line (for example, does not ramp up/down the program voltage Vpgm) to program the plurality of memory cells 414 coupled to the first word line in the first memory cell slice 410 firstly, and then program the plurality of memory cells 414 coupled to the first word line in the second memory cell slice 420. Therefore, as shown in FIG. 14, operation S1 includes at least suboperations S11-S12.

Sub-operation S11, Programming a plurality of memory cells 414 coupled to the first word line in the first memory cell slice 410.

Continuing with reference to FIG. 13, when the row decoder 630 supplies the program voltage Vpgm to the first word line and the turn-on voltage Von to the first string select line SSL1, the control logic unit 620 also controls the page buffer 660 to supply a first bit line voltage generated by the voltage generator 640 to the first bit line, and a second bit line voltage to the second bit line. It should be noted that the first bit line voltage is the program select voltage Vss, and the first bit line can also be called the selected bit line. The second bit line voltage is the program inhibit voltage Vinhibit, and the second bit line can also be called the non-selected bit line.

Furthermore, the control logic unit 620 controls the row decoder 630 to supply a first pass voltage Vpass1 generated by the voltage generator 640 to the second word line (for example the non-selected word line), and controls the row decoder 630 to supply a third pass voltage Vpass3 generated by the voltage generator 640 to the third word line (for example a dummy word line).

For example, during the stage where the control logic unit 620 controls the row decoder 630 to apply the program voltage Vpgm to the first word line and apply the turn-on voltage Von to the first string select line SSL1, the control logic unit 620 also controls the row decoder 630 to apply the first pass voltage Vpass1 to the second word line. Meanwhile, the control logic unit 620 controls the page buffer 660 to apply the first bit line voltage to the first bit line, and apply the second bit line voltage to the second bit line. The memory cells 414 coupled to the first word line in the first memory cell slice 410 are therefore programmed.

Figure 15:
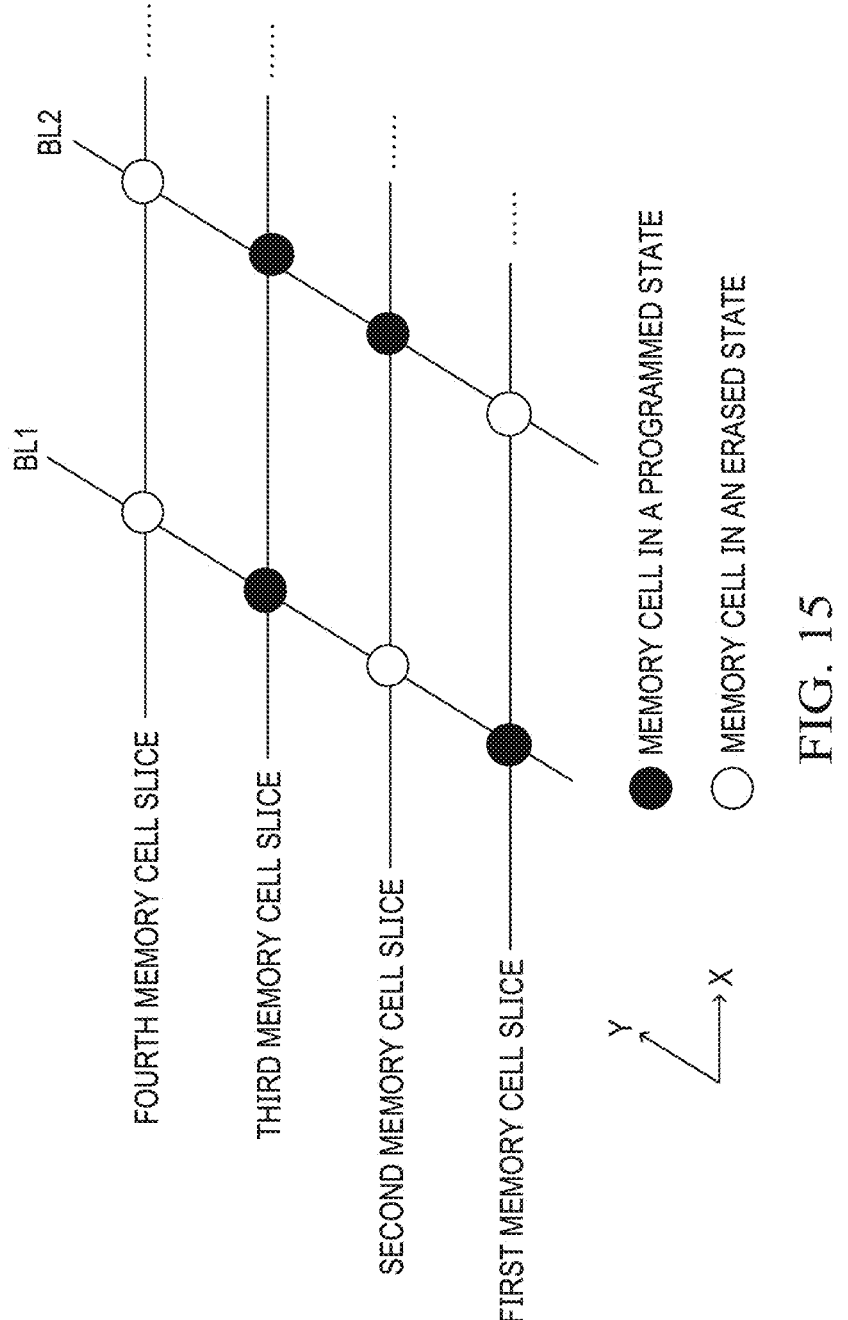
FIG. 15 is a schematic diagram of a possible programming result of the memory according to an example of the present disclosure.

The first bit line and the second bit line in this disclosure do not refer to a specific bit line. As an example, as shown in FIG. 13, during the stage where the row decoder 630 applies the turn-on voltage Von to the first string select line SSL1, the bit line BL1 is the first bit line, and the bit line BL2 is the second bit line. Thus, the memory cells 414 coupled to the bit line BL1 in the first memory cell slice 410 are programmed into a programmed state (as shown in FIG. 15); the memory cells 414 coupled to the bit line BL2 in the first memory cell slice 410 are kept in an erased state (as shown in FIG. 15).

Sub-operation S12, Programming the plurality of memory cells 414 coupled to the first word line in the second memory cell slice 420.

When the row decoder 630 supplies the program voltage Vpgm to the first word line, and supplies the turn-on voltage Von to the second string select line SSL2, the control logic unit 620 also controls the page buffer 660 to supply the first bit line voltage generated by the voltage generator 640 to the first bit line, and supply the second bit line voltage to the second bit line, similarly to the suboperation S11.

Different from the suboperation S11, the control logic unit 620 controls the row decoder 630 to supply the second pass voltage Vpass2 generated by the voltage generator 640 to the second word line, and controls the row decoder 630 to supply the fourth pass voltage Vpass4 generated by the voltage generator 640 to the third word line.

For example, during the stage where the control logic unit 620 controls the row decoder 630 to apply the program voltage Vpgm to the first word line and apply the turn-on voltage Von to the second string select line SSL2, the control logic unit 620 also controls the row decoder 630 to apply the second pass voltage Vpass2 to the second word line. Meanwhile, the control logic unit 620 controls the page buffer 660 to apply the first bit line voltage to the first bit line, and apply the second bit line voltage to the second bit line. Thus, a program operation is performed on the memory cells 414 coupled to the first word line in the second memory cell slice 420. However, as shown in FIG. 13, during the stage where the row decoder 630 applies the turn-on voltage Von to the second string select line SSL2, the bit line BL1 is the second bit line, and the bit line BL2 is the first bit line. Thus, the memory cells 414 coupled to the bit line BL2 in the second memory cell slice 420 are programmed into the programmed state (as shown in FIG. 15), and the memory cells 414 coupled to the bit line BL1 in the second memory cell slice 420 are kept in the erased state (as shown in FIG. 15).

One of the differences in the relevant descriptions of the above suboperation S11 and suboperation S12 is that, during the stage where the row decoder 630 applies the turn-on voltage Von to the first string select line SSL1, the row decoder 630 applies the first pass voltage Vpass1 to the second word line and applies the third pass voltage Vpass3 to the third word line. During the stage where the row decoder 630 applies the turn-on voltage Von to the second string select line SSL2, the row decoder 630 applies the second pass voltage Vpass2 to the second word line and applies the fourth pass voltage Vpass4 to the third word line.

In the example of the present disclosure, the second pass voltage Vpass2 is greater than the first pass voltage Vpass1. During the stage where the row decoder 630 applies the turn-on voltage Von to the second string select line SSL2, the row decoder 630 supplies the turn-off voltage Voff to the first string select line SSL1. At this time, the top select transistors 412 of all the memory cell strings 411 of the first memory cell slice 410 are turned off. Based on the self-boosting program inhibit (SBPI) mechanism, when the row decoder 630 applies the second word line the second pass voltage Vpass2 with a higher voltage value than the previous stage (the stage where the row decoder 630 applies the turn-on voltage Von to the first string select line SSL1), all the memory cell strings 411 of the first memory cell slice 410 are enabled to raise the channel potential through the gate voltage and capacitive coupling, thereby reduces the potential difference between the control gate potential and the channel potential of the memory cells 414 of the first memory cell slice 410, so that it is difficult for the charges to tunnel into the floating gates of the memory cells 414 of the first memory cell slice 410, thereby inhibiting the first memory cell slice from being programmed. Likewise, the fourth pass voltage Vpass4 is greater than the third pass voltage Vpass3.

In an example, when the control logic unit 620 controls the row decoder 630 to apply the program voltage Vpgm to the first word line (selected word line), the control logic unit 620 also controls the row decoder 630 to apply the turn-on voltage Von to a plurality of string select lines in sequence, to apply the pass voltage with increasing voltage value to the second word line (non-selected word line), and to apply the pass voltage with increasing voltage value to the third word line (dummy word line).

In the programming method according to the example of the present disclosure, the plurality of memory cells 414 coupled to the first word line in the third memory cell slice (group 3) 430 can be programmed sequentially after the suboperation S12, and the plurality of memory cells 414 coupled to the first word line in the fourth memory cell slice (group 4) 440 are programmed. As shown in FIG. 13, during the stage where the row decoder 630 applies the turn-on voltage Von to the third string select line SSL3 among the plurality of string select lines, the row decoder 630 also applies the fifth pass voltage Vpass5 to the second word line, and applies the seventh pass voltage Vpass7 to the third word line. During the stage where the row decoder 630 applies the turn-on voltage Von to the fourth string select line SSL4 among the plurality of string select lines, the row decoder 630 also applies the sixth pass voltage Vpass6 to the second word line, and applies the eighth pass voltage Vpass8 to the third word line. The sixth pass voltage Vpass6 is greater than the fifth pass voltage Vpass5 that is greater than the second pass voltage Vpass2, and the eighth pass voltage Vpass8 is greater than the seventh pass voltage Vpass7 that is greater than the fourth pass voltage Vpass4.

Operation S2. During a verification stage of a programming cycle, continuously verifying the plurality of memory cell slices coupled to the first word line.

Different from operation S1, in operation S2, the control logic unit 620 controls the row decoder 630 to supply the verification voltage generated by the voltage generator 640 to the first word line. For example, during the verification stage of a programming cycle, the row decoder 630 applies the same verification voltage to the first word line (e.g., does not ramp up/down the program voltage).

The multiple memory cell slices continuously verified in operation S2 are the multiple memory cell slices continuously programmed in operation S1. For example, operation S2 includes at least sequentially performing verification on multiple memory cells 414 coupled to the first word line in the first memory cell slice 410, and multiple memory cells 414 coupled to the first word line in the second memory cell slice 420.

A programming method of a memory, a memory, and a memory system according to an example of the present disclosure allow multiple memory cell slices to be continuously programmed in a programming stage of one programming cycle, and allow multiple memory cell slices to be programmed with one program voltage. Moreover, during a verification stage of one programming cycle, multiple memory cell slices are verified continuously, and multiple memory cell slices are verified with one verification voltage. Thus, the number of ramp-up/ramp-down of the voltage can be reduced to a certain extent, the time needed for the ramp-up/ramp-down of the voltage in programming cycles can be reduced, and the time needed for programming the memory can be shortened.

An example of the present disclosure provides a computer-readable storage medium storing therein computer-executable instructions that, when executed, enable the method as shown in FIG. 12.

An example of the present disclosure provides a computer device, including a processor, and a readable storage medium coupled to the processor. The readable storage medium stores executable instructions that, when executed by the processor, enable the method as shown in FIG. 12.

Those skilled in the art can clearly understand that the descriptions of each of the above-mentioned examples highlight different aspects for the convenience and brevity of description, and the parts that are not described in detail in a certain example can be referred to the corresponding process in the aforementioned method example and will not be repeated herein.

The provided programming method, memory and memory system in the several examples according to this disclosure can be implemented in other manners. For example, the division of a certain module is only a logical function division, and there may be other division methods in actual examples. As an example, multiple units or components can be combined or integrated into another system, or some features can be ignored or not be performed.

Those skilled in the art can appreciate that the modules and algorithm operations of the examples described in conjunction with the examples disclosed herein can be implemented in electronic hardware, or a combination of computer software and electronic hardware. Whether these functions are implemented in hardware or software depends on the specific application and design constraints of the technical solution. Skilled artisans may use different methods to implement the described functions for each specific application, but such example should not be regarded as going beyond the scope of the present disclosure.

The above description is only an example of the present disclosure, but the scope of protection of the present disclosure is not limited thereto. Any changes or substitutions that can be easily conceived by those skilled in the art within the technical scope disclosed in the present disclosure shall be encompassed within the protection scope of the present disclosure. Therefore, the protection scope of the present disclosure should be determined by the protection scope of the claims.

What is claimed is:

1. A programming method of a memory, comprising:
applying a program voltage to a first word line coupled to a plurality of memory cells of a first memory cell slice and a plurality of memory cells of a second memory cell slice;
during a stage of applying the program voltage to the first word line, applying a turn-on voltage to a first select line and a second select line sequentially, wherein the first select line is coupled to a select transistor of the first memory cell slice, and the second select line is coupled to a select transistor of the second memory cell slice; and
after applying the program voltage to the first word line:
applying a verification voltage to the first word line; and
during a stage of applying the verification voltage to the first word line, applying a turn-on voltage to the first select line and the second select line sequentially.

2. The programming method of claim 1, wherein,
during a stage of applying the turn-on voltage to the first select line, applying a first pass voltage to a second word line, wherein the second word line is coupled to another plurality of memory cells of the first memory cell slice and another plurality of memory cells of the second memory cell slice; and
during a stage of applying the turn-on voltage to the second select line, applying a second pass voltage to the second word line.

3. The programming method of claim 2, wherein the second pass voltage is greater than the first pass voltage.

4. The programming method of claim 1, further comprising:
during a stage of applying the turn-on voltage to the first select line, applying a third pass voltage to a third word line, wherein the third word line is coupled to a plurality of dummy memory cells of the first memory cell slice and a plurality of dummy memory cells of the second memory cell slice; and
during a stage of applying the turn-on voltage to the second select line, applying a fourth pass voltage to the third word line.

5. The programming method of claim 4, wherein the fourth pass voltage is greater than the third pass voltage.

6. The programming method of claim 1, further comprising:

during the stage of applying the program voltage to the first word line, applying a first bit line voltage to a first bit line and a second bit line voltage to a second bit line, wherein the first bit line is coupled to one memory cell string of the first memory cell slice and one memory cell string of the second memory cell slice, and the second bit line is coupled to another memory cell string of the first memory cell slice and another memory cell string of the second memory cell slice.

7. The programming method of claim 1, wherein the memory cells of the memory comprise single-level cells (SLC).

8. A memory, comprising:

a memory cell array comprising a first memory cell slice and a second memory cell slice;

a first word line coupled to a plurality of memory cells of the first memory cell slice and a plurality of memory cells of the second memory cell slice;

a first select line coupled to a select transistor of the first memory cell slice;

a second select line coupled to a select transistor of the second memory cell slice; and a peripheral circuit coupled to the first word line, the first select line, and the second select line respectively, and configured to:

apply a program voltage to the first word line;

during a stage of applying the program voltage to the first word line, apply a turn-on voltage to the first select line and the second select line sequentially; and after applying the program voltage to the first word line:

apply a verification voltage to the first word line; and during a stage of applying the verification voltage to the first word line, apply a turn-on voltage to the first select line and the second select line sequentially.

9. The memory of claim 8, further comprising:

a second word line coupled to another plurality of memory cells of the first memory cell slice and another plurality of memory cells of the second memory cell slice, wherein the peripheral circuit is further configured to:

during a stage of applying the turn-on voltage to the first select line, apply a first pass voltage to the second word line; and during a stage of applying the turn-on voltage to the second select line, apply a second pass voltage to the second word line.

10. The memory of claim 9, wherein the second pass voltage is greater than the first pass voltage.

11. The memory of claim 8, further comprising:

a third word line coupled to a plurality of dummy memory cells of the first memory cell slice and a plurality of dummy memory cells of the second memory cell slice, wherein the peripheral circuit is further configured to:

during a stage of applying the turn-on voltage to the first select line, apply a third pass voltage to a third word line; and during a stage of applying the turn-on voltage to the second select line, apply a fourth pass voltage to the third word line.

12. The memory of claim 11, wherein the fourth pass voltage is greater than the third pass voltage.

13. The memory of claim 8, further comprising:

a first bit line coupled to one memory cell string of the first memory cell slice and one memory cell string of the second memory cell slice; and a second bit line coupled to another memory cell string of the first memory cell slice and another memory cell string of the second memory cell slice, wherein the peripheral circuit is further configured to:

during the stage of applying the program voltage to the first word line, apply a first bit line voltage to the first bit line and a second bit line voltage to the second bit line.

14. The memory of claim 8, wherein the memory cells of the memory comprise single-level cells (SLC).

15. A memory system, comprising:

a memory comprising:

a memory cell array comprising a first memory cell slice and a second memory cell slice;

a first word line coupled to a plurality of memory cells of the first memory cell slice and a plurality of memory cells of the second memory cell slice;

a first select line coupled to a select transistor of the first memory cell slice;

a second select line coupled to a select transistor of the second memory cell slice; and a peripheral circuit coupled to the first word line, the first select line, and the second select line respectively, and configured to:

apply a program voltage to the first word line;

during a stage of applying the program voltage to the first word line, apply a turn-on voltage to the first select line and the second select line sequentially; and a memory controller configured to control the memory; and after applying the program voltage to the first word line:

apply a verification voltage to the first word line; and during a stage of applying the verification voltage to the first word line, apply a turn-on voltage to the first select line and the second select line sequentially.

16. The memory system of claim 15, wherein the memory further comprises:

a second word line coupled to another plurality of memory cells of the first memory cell slice and another plurality of memory cells of the second memory cell slice, wherein the peripheral circuit is further configured to:

during a stage of applying the turn-on voltage to the first select line, apply a first pass voltage to the second word line; and during a stage of applying the turn-on voltage to the second select line, apply a second pass voltage to the second word line.

17. The memory system of claim 16, wherein the second pass voltage is greater than the first pass voltage.

18. The memory system of claim 15, wherein the memory further comprises:

a third word line coupled to a plurality of dummy memory cells of the first memory cell slice and a plurality of dummy memory cells of the second memory cell slice, wherein the peripheral circuit is further configured to:

during a stage of applying the turn-on voltage to the first select line, apply a third pass voltage to a third word line; and during a stage of applying the turn-on voltage to the second select line, apply a fourth pass voltage to the third word line.

19. The memory system of claim 18, wherein the fourth pass voltage is greater than the third pass voltage.

20. The memory system of claim 15, wherein the memory further comprises:

a first bit line coupled to one memory cell string of the first memory cell slice and one memory cell string of the second memory cell slice; and a second bit line coupled to another memory cell string of the first memory cell slice and another memory cell string of the second memory cell slice, wherein the peripheral circuit is further configured to:

during the stage of applying the program voltage to the first word line, apply a first bit line voltage to the first bit line and a second bit line voltage to the second bit line.

\*  \*  \*  \*  \*